US010472986B2

(12) United States Patent  
Akin (10) Patent No.: US 10,472,986 B2  
(45) Date of Patent: Nov. 12, 2019

(54) SYSTEMS FOR THERMOELECTRIC COOLING FOR JET AIRCRAFT PROPULSION SYSTEMS

(71) Applicant: United Technologies Corporation, Hartford, CT (US)

(72) Inventor: John Akin, Wethersfield, CT (US)

(73) Assignee: United Technologies Corporation, Farmington, CT (US)

(*) Notice: Subject to any disclaimer, the term of this patent is extended or adjusted under 35 U.S.C. 154(b) by 313 days.

(21) Appl. No.: 15/030,317

(22) PCT Filed: Jan. 15, 2015

(86) PCT No.: PCT/US2015/011569  
§ 371 (c)(1),  
(2) Date: Apr. 18, 2016

(87) PCT Pub. No.: WO2015/156872  
PCT Pub. Date: Oct. 15, 2015

(65) Prior Publication Data  
US 2016/0319697 A1 Nov. 3, 2016

Related U.S. Application Data

(60) Provisional application No. 61/931,405, filed on Jan. 24, 2014.

(51) Int. Cl.  
*F01D 25/12* (2006.01)  
*F01D 11/14* (2006.01)  
(Continued)

(52) U.S. Cl.  
CPC .............. *F01D 25/12* (2013.01); *B64D 41/00* (2013.01); *F01D 11/14* (2013.01); *F01D 25/24* (2013.01);  
(Continued)

(58) Field of Classification Search  
CPC ..... F01D 11/14–24; F25B 21/02; F25B 21/04  
See application file for complete search history.

(56) References Cited

U.S. PATENT DOCUMENTS 5,282,721 A * 2/1994 Kildea ................... F01D 11/10  
415/173.1  
5,702,185 A 12/1997 Heikal  
(Continued)

FOREIGN PATENT DOCUMENTS

FR WO97/22489 * 6/1997  
WO 9722489 6/1997  
(Continued)

OTHER PUBLICATIONS

International Search Report and Written Opinion dated Nov. 23, 2015 in Application No. PCT/US2015/011569.  
(Continued)

*Primary Examiner* — Keith M Raymond  
(74) *Attorney, Agent, or Firm* — Snell & Wilmer, L.L.P.

(57) ABSTRACT

An aircraft jet propulsion system may comprise a thermoelectric cooler array coupled to a portion thereof, wherein the TEC array converts electrical energy to heat energy to create a temperature gradient and cools a turbine case using the temperature difference of the TEC array. The system may include a controller configured to control an input power provided to each TEC of the array of TECs, such that the array of TECs facilitates controlled cooling of the aircraft jet propulsion system in response to the input power provided to each TEC of the array of TECs. The TEC array may be powered by an alternator or by a thermoelectric generator.

11 Claims, 5 Drawing Sheets

(51) Int. Cl.
*F01D 25/24* (2006.01)
*F25B 21/02* (2006.01)
*B64D 41/00* (2006.01)
*F02C 7/12* (2006.01)
*H01L 35/32* (2006.01)

(52) U.S. Cl.
CPC ............... *F02C 7/12* (2013.01); *F25B 21/02* (2013.01); *H01L 35/32* (2013.01); *F05D 2220/32* (2013.01); *F05D 2260/20* (2013.01); *F05D 2270/80* (2013.01); *F25B 2321/023* (2013.01); *F25B 2321/0212* (2013.01); *F25B 2321/0251* (2013.01)

(56) References Cited

U.S. PATENT DOCUMENTS

| | | | |
|---|---|---|---|
| 5,918,469 A | 7/1999 | Cardella | |
| 7,954,331 B2* | 6/2011 | Ullman | F25B 21/02 62/3.2 |
| 8,764,383 B2* | 7/2014 | Deperrois | F02C 7/32 415/122.1 |
| 2003/0110779 A1* | 6/2003 | Otey | F25B 21/02 62/3.2 |
| 2010/0011781 A1* | 1/2010 | Lents | B64D 13/00 62/3.7 |
| 2010/0139288 A1* | 6/2010 | Rago | F01D 11/24 60/785 |
| 2013/0319016 A1 | 12/2013 | Fontanel et al. | |

FOREIGN PATENT DOCUMENTS

| | | | |
|---|---|---|---|
| WO | 2013141937 | 9/2013 | |
| WO | WO 2013141937 A1 * | 9/2013 | ............ F01D 11/20 |

OTHER PUBLICATIONS

International Preliminary Report on Patentability dated Jul. 26, 2016 in Application No. PCT/US2015/011569.

* cited by examiner

SYSTEMS FOR THERMOELECTRIC COOLING FOR JET AIRCRAFT PROPULSION SYSTEMS

CROSS-REFERENCE TO RELATED APPLICATIONS

This application is U.S. national phase filing under 35 U.S.C. § 371 of PCT/US2015/011569 filed on Jan. 15, 2015 and entitled "SYSTEMS FOR THERMOELECTRIC COOLING FOR JET AIRCRAFT PROPULSION SYSTEMS," which claims priority from U.S. Provisional Application No. 61/931,405 filed on Jan. 24, 2014 and entitled "SYSTEMS FOR THERMOELECTRIC COOLING FOR JET AIRCRAFT PROPULSION SYSTEMS." Both of the aforementioned applications are incorporated herein by reference in their entirety.

FIELD

The present disclosure relates to a cooling system, and more particularly, to a thermoelectric cooling system for use with a jet aircraft propulsion system.

BACKGROUND

Jet aircraft propulsion systems (e.g., a gas turbine engine coupled to a nacelle) generate large amounts of heat energy. A variety of cooling systems are available to cool these systems. For example, propulsion systems may be cooled by air cooling systems, radiative cooling systems, and other similar cooling systems. One typical air cooling system involves directing large quantities of fan stream air through piping to directly impinging on a turbine case. However, the diverting of the air stream for cooling purposes reduces the thrust generated by the turbine.

SUMMARY

An aircraft jet propulsion system is disclosed. The aircraft jet propulsion system may comprise a thermoelectric cooler array ("TEC array") coupled to a portion of the aircraft jet propulsion system, wherein the TEC array converts electrical energy to heat energy to create a temperature gradient. The aircraft jet propulsion system may also comprise a TEC array that converts electrical energy to heat energy and cools a turbine case using the temperature difference of the TEC array. The system may include a controller configured to control an input power provided to each TEC of the array of TECs, such that the array of TECs facilitates controlled cooling of the aircraft jet propulsion system in response to the input power provided to each TEC of the array of TECs. The TEC array may be powered by an alternator or by a thermoelectric generator.

In various embodiments, the TEC array may be coupled to an exhaust portion of the aircraft jet propulsion system, and the exhaust portion may comprise an exhaust nozzle. The TEC array may be coupled to any of: an outer surface of an inner fixed structure ("IFS"), an inner surface of a nacelle, between a heat blanket and an inner surface of a nacelle, to an outer surface of a heat blanket mounted to an inner surface of a nacelle, an air inlet, an air inlet outboard of an anti-ice system, and the like.

A TEC array is disclosed. In various embodiments, the TEC array may comprise a first set of thermoelectric coolers coupled in series and/or a second set of TECs coupled in series, wherein the first set of TECs and the second TECs may be coupled in parallel. In various embodiments, the TEC array may comprise six sets of TECs, each set electrically coupled in parallel. In other various embodiments, the TEC array may comprise six sets of TECs, each set electrically coupled in series.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the inventions, it should be understood that other embodiments may be realized and that logical, material, electrical, and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

As used herein, "aft" refers to the direction associated with the tail (e.g., the back end) of an aircraft, or generally, to the direction of exhaust of the gas turbine. As used herein, "forward" refers to the direction associated with the nose (e.g., the front end) of an aircraft, or generally, to the direction of flight or motion.

As described above, jet aircraft propulsion systems generate large amounts of heat energy. A variety of cooling systems are available to cool these propulsion systems. For example, propulsion systems may be cooled by air cooling systems, radiative cooling systems, and other like cooling systems. In operation, however, these cooling systems may reduce thrust due to diverting air flow.

Figure 1:
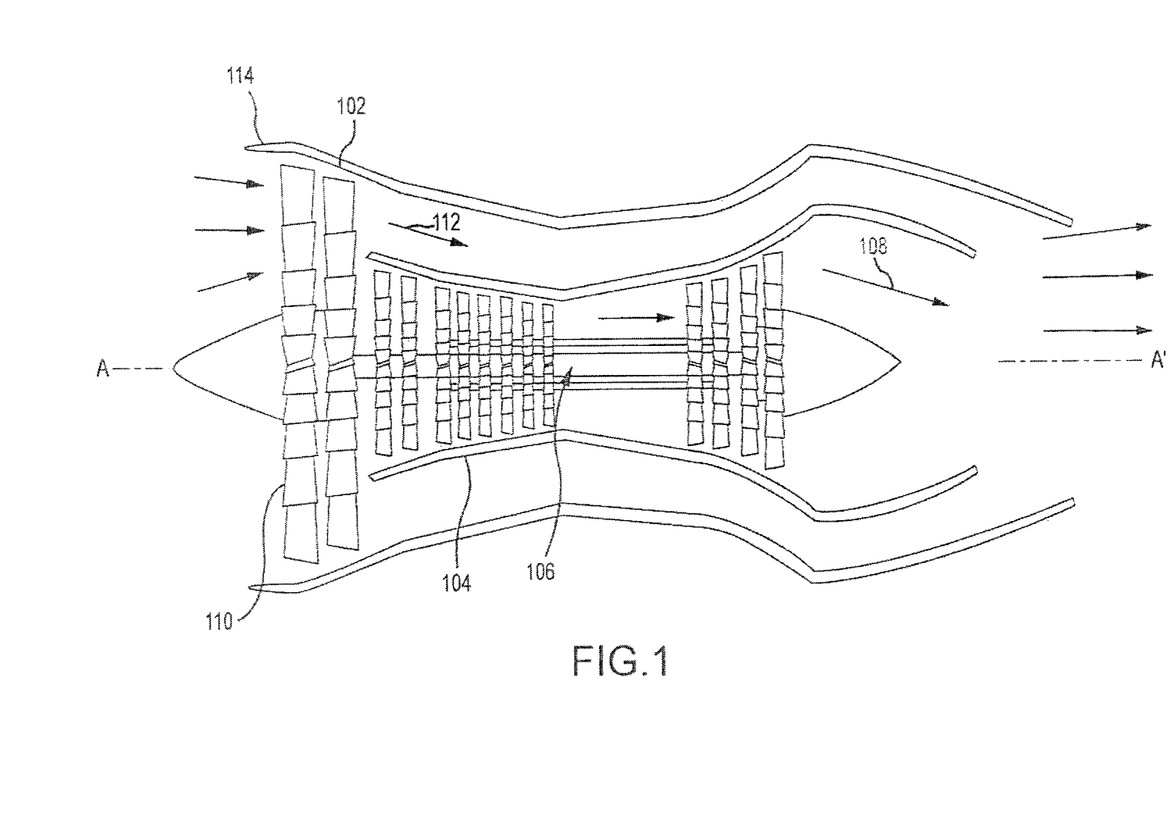
FIG. 1 illustrates, in accordance with various embodiments, a cross-sectional view of a turbofan engine.

With reference to FIG. 1, an aircraft propulsion system 100 is shown and may generally comprise a nacelle 102 comprising an inner fixed structure ("IFS") 104. The aircraft propulsion system 100 may generally extend from forward to aft along the axis A-A', with point A being forward of point A' and point A' being aft of point A In flight, air from point A may flow around and/or through aircraft propulsion system 100 in the direction from point A to point A'. The nacelle 102 may define an outer airflow surface of the aircraft propulsion system 100. The nacelle 102 may include an air inlet 114 through which air may enter aircraft propulsion system 100. An anti-ice system (not shown, and which may heat the air inlet to melt ice) may be disposed within the air inlet 114. The IFS 104 may define an inner airflow surface of the aircraft propulsion system 100. The IFS 104 may be disposed coaxially to engine core 106. The engine core 106 may burn a hydrocarbon fuel in the presence of compressed air to generate exhaust gas 108. The exhaust gas 108 may be expanded across a turbine 116 to drive turbofan 110 at the forward portion of the aircraft propulsion system 100. The turbofan 110 may rotate to generate bypass fan airflow 112 between an interior surface of the nacelle 102 and an exterior surface of the IFS 104.

Figure 2:
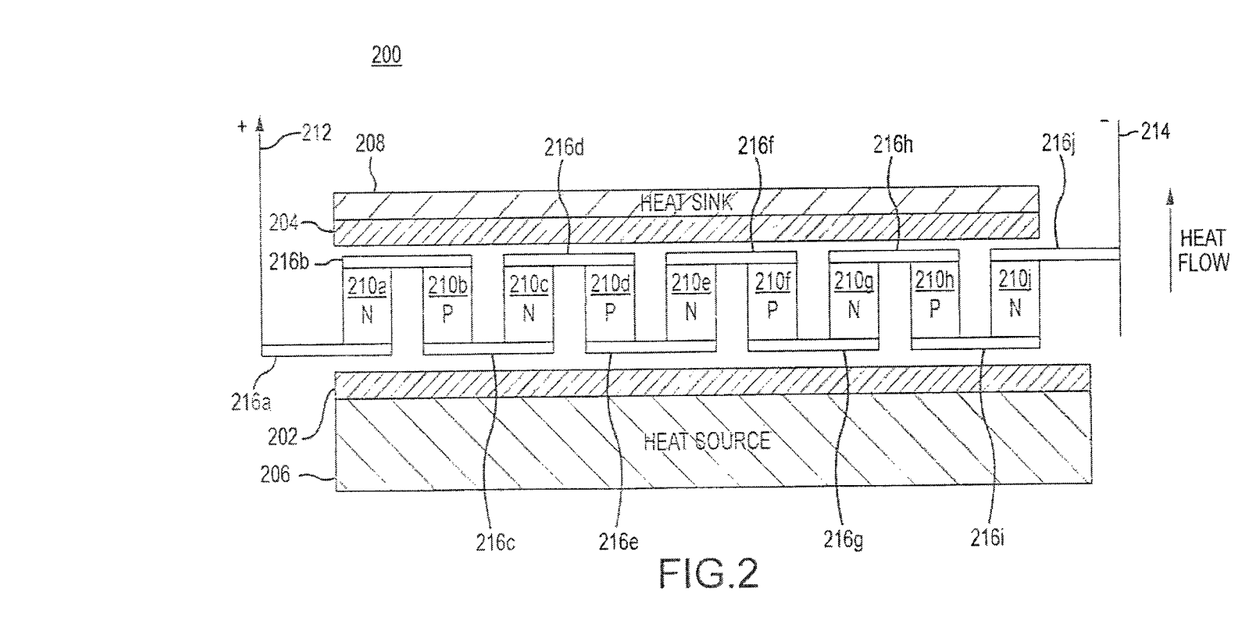
FIG. 2 illustrates, in accordance with various embodiments, a cross-sectional view of a TEC.

With reference to FIG. 2, a thermoelectric cooler ("TEC") 200 may be coupled to one or more portions of aircraft propulsion system 100 to facilitate removal of the heat generated by aircraft propulsion system 100. Referring to FIG. 2, although TECs may vary in the construction and/or composition, TEC 200 may generally comprise first substrate 202 and a second substrate 204. The first substrate 202 may comprise any substrate capable of conducting heat, such as a metallic or ceramic wafer. The second substrate 204 may also comprise any substrate capable of conducting heat, such as a metallic or ceramic wafer. The first substrate 202 may be in thermal contact with a heat source 206. Thermal contact, as used herein, may mean that two objects may exchange heat. Heat may be exchanged by convection, conduction, and/or radiation. The second substrate 204 may be in contact with heat sink 208 and/or, in general, with any material or surface that may be configured to dissipate heat. The heat source 206 may generate energy as heat, while the heat sink 208 may absorb and/or dissipate energy as heat.

A plurality of thermoelectric semiconductors 210a-210i may be situated or laminated between the first substrate 202 and the second substrate 204. Each thermoelectric semiconductor 210a-210i may comprise either of an n-type material (e.g., 210a, 210c, 210e, 210g, and 210i) or a p-type material (e.g., 210b, 210d, 210f, and 210h). Each thermoelectric semiconductor 210a-210i may be electrically coupled through a respective electrical interconnect 216a-216j. Thus, each thermoelectric semiconductor 210a-210i may be thermally coupled in parallel and electrically coupled in series and together form TEC 200.

An n-type material may comprise a semiconductor doped with an electron donating material or impurity. A p-type material may comprise a semiconductor doped with an electron accepting material or impurity. An electron donating impurity may contribute free electrons to the semiconductor. These electrons may move within the semiconductor. An electron accepting impurity may contribute atoms capable of accepting electrons to the semiconductor. The absence of an electron in the valence band of an electron accepting impurity may be referred to as a "hole." A hole may function as charge carrier that may move within the semiconductor.

The n-type and p-type materials may comprise a variety of semiconducting materials, and all are contemplated by this disclosure. However, in various embodiments, an n-type material may comprise an intrinsic semiconductor (such as Silicon, Germanium, Aluminum phosphide, Aluminum arsenide, Gallium arsenide, Gallium nitride, and the like) doped with any impurity that donates electrons (e.g., Phosphorous, Arsenic, Selenium, Tellurium, Silicon, Germanium, and the like). A p-type material may comprise an intrinsic semiconductor doped with any impurity that accepts electrons (e.g., Boron, Aluminum, Beryllium, Zinc, Cadmium, Silicon, Germanium, and the like).

In operation, heat energy from the heat source 206 may be absorbed by the first substrate 202 and rejected, or dissipated, by the second substrate 204. The temperature gradient between the heat source 206 and the heat sink 208 may drive electrons (in the n-type material) and/or holes (in the p-type material) through each material. Moreover, the conduction of power through the TEC 200 may drive electrons in the opposite direction and increase the temperature gradient between the heat source 206 and the heat sink 208. An external electrical connection comprising a positive contact 212 and a negative contact 214 may conduct electrical current provided by an external circuit to TEC 200. In an embodiment, TEC 200 may utilize a thermoelectric effect (e.g., the Peltier effect) to convert electrical energy into a cooling source, however, it will be understood by those of ordinary skill in the art that any method of converting electric energy into heat energy may be used.

Thus, the TEC 200 (or a TEC array comprising a plurality of TECs 200, as described below) may be coupled or situated between any two surfaces and powered to set a temperature gradient between the two surfaces. For instance, TEC 200 may be situated between a first "hot" surface in a jet aircraft propulsion system and a second "cool" surface of the propulsion system, where the terms "hot" and "cool" are simply relative to one another during operation and between the two, define a temperature gradient. In various embodiments, TEC 200 may control the temperature gradient by controlling the temperature of at least one of the hot or cold surfaces.

Figure 3:
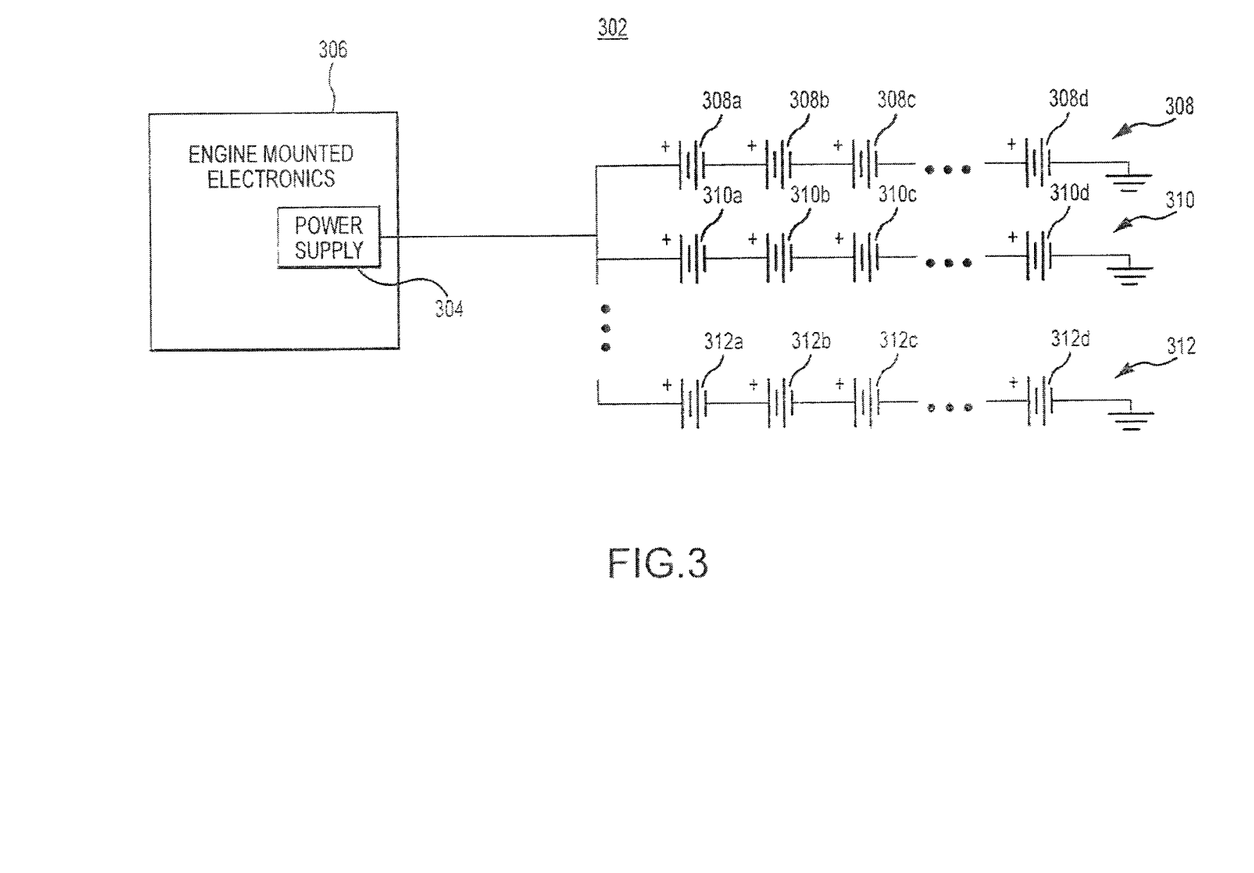
FIG. 3 illustrates, in accordance with various embodiments, a circuit diagram of a TEC array.

Therefore, with reference to FIG. 3, a TEC array 302 is shown. The TEC array 302 may be electrically coupled to a power supply 304, which may provide the power input to TEC array 302. Power supply 304 may be controlled by a controller 306. In general, TEC 200 and/or TEC array 302 may be expected to generate a selected temperature gradient based on an input power. For example, in various embodiments, a TEC 200 may be expected to generate about 50-500° C. (about 122-932° F.) ($\Delta T$) having an input power of about 200 watts to about 1000 watts. Thus, although the temperature gradient generated by a single TEC 200 may be useful for certain purposes and in certain locations, in other circumstances, greater heat diffusion may be generated by TEC array 302.

In accordance with various embodiments, TEC 200 may be relatively small in size, such as approximately 3.5 $in^2$ to 25 $in^2$ (approximately 9 $cm^2$ to 64 $cm^2$) and approximately ¼ inches to 1 inch thick (approximately ⅔ cm to 2.54 cm). The dimensions of the TEC can widely vary depending on manufacturing and availability. Additional embodiments of a TEC may be thicker than approximately 1 inch (approximately 2.54 cm), which may have greater temperature differential capabilities than a comparable thinner TEC.

To this end and with continued reference to FIG. 3, the TEC array 302 may comprise a plurality of sets of TECs, e.g., sets 308, 310, and 312. Set 308 may comprise TECs 308a-308d. Set 310 may comprise TECs 310a-310d. Set 312 may comprise TECs 312a-312d. Sets 308, 310, and 312 may be electrically coupled in parallel with each other. Further, each of TECs 308a-308d may be electrically connected in series with each other. Likewise, each of TECs 310a-310d may be electrically connected in series with each other, and each of TECs 312a-312d may be electrically connected in series with each other.

In various embodiments, although three sets 308, 310, and 312 of four TECs 308a-308d, 310a-310d, and 312a-312d each are shown, any number of TECs may be coupled in series, and any number of sets of series coupled TECs may be coupled in parallel to form a TEC array 302. In various embodiments, and as explained in additional detail below, six TECs may be electrically coupled in series. In addition, in various embodiments, six sets of series coupled TECs may additionally form a TEC array.

Figure 4:
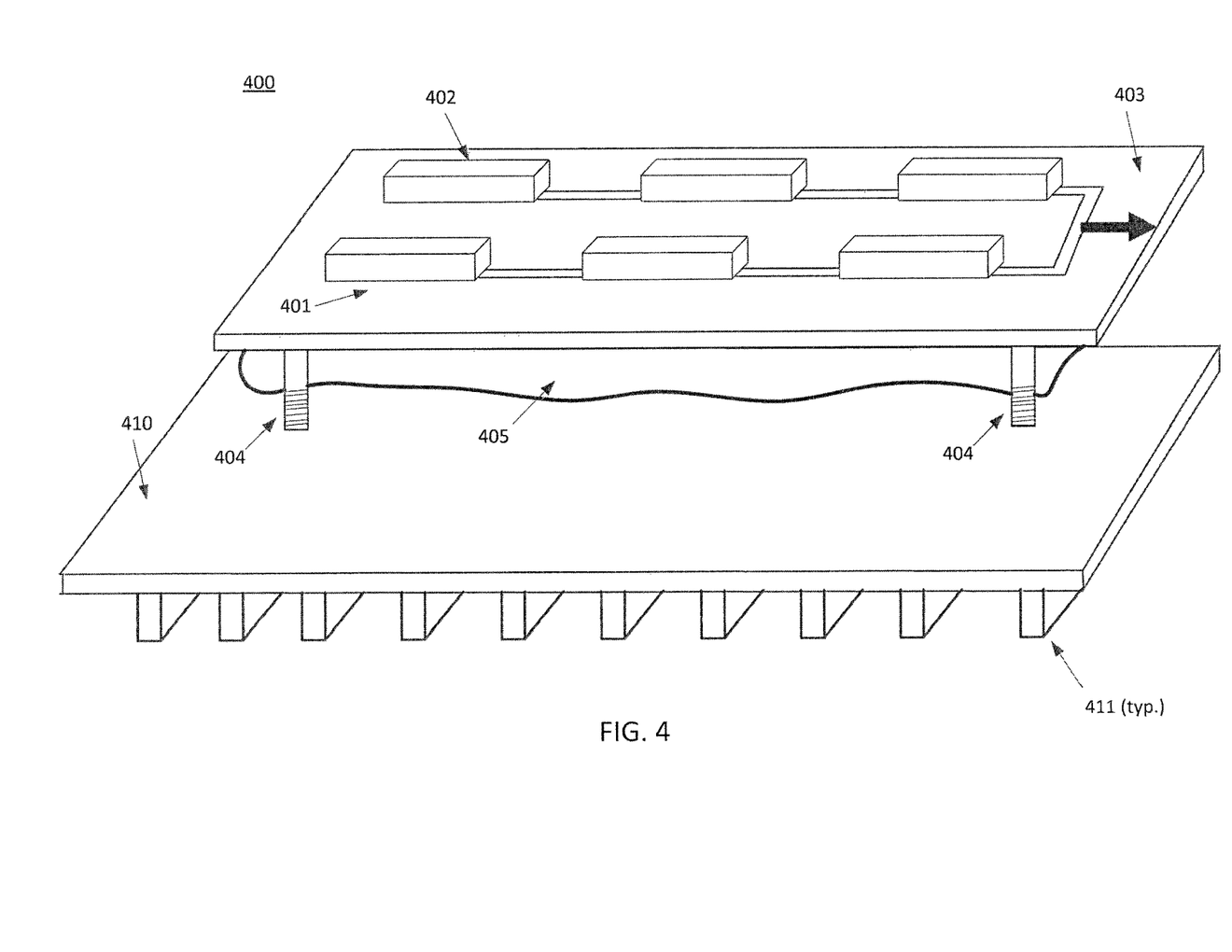
FIG. 4 illustrates, in accordance with various embodiments, an isometric view of an exemplary TEC array.

In accordance with various embodiments and with reference to FIG. 4, a TEC array 400 may comprise a first set of thermoelectric coolers ("TECs") 401 coupled in series, and a second set of TECs 402 coupled in series. The first set of TECs 401 and the second TECs 402 may be coupled in parallel. The TEC array 400 may be configured for controlled cooling of a turbo fan engine. For example, TEC array 400 may be coupled to a turbine case 410 having heat fins 411. In various embodiments, the TEC array 400 may further comprise a backing structure 403 shaped to complement an attachment surface. The backing structure 403 may provide structural support of the TEC array 400, or multiple TEC arrays, to make moving, installing, and replacing the TEC arrays 400 easier. The backing structure 403 may be shaped to complement the intended attachment surface, for example, by having a curvature that complements a turbine case where the TEC arrays are installed. In various embodiments, the backing structure 403 may be flexible and enable attachment of TEC arrays 400 to multiple surfaces, flat or curved, in a convenient manner.

Furthermore, in various embodiments, TEC array 400 may further comprise at least one mechanical fastener 404 configured to attach the TEC array 400 to an attachment surface. The mechanical fastener 404 may be a bolt or rod, or other suitable fastening mechanism as would be known to one skilled in the art. In addition, various embodiments of TEC array 400 may further comprise at least one of a silicone layer or epoxy layer 405 between the sets of TECs 401, 402 and the attachment surface for conducting heat. The silicone or epoxy layer 405 enable efficient transfer of heat from the TEC array 400 to the attachment surface, while maintaining flexibility to allow for the expansion or contraction of the attachment surface and/or TEC array 400.

In accordance with various embodiments, one or more controllers may be designed to control one or more TECs by controlling the input power provided to the TECs. Although various embodiments may be described as having a controller, multiple controllers are also contemplated as would be understood by one skilled in the art. The controller may be located at the core control system of the engine such as the FADEC (Full Authority Digital Engine Control), mounted on a fan case, or any other suitable location in communication with the TECs. In various embodiments, the controller may comprise multiple controllers. The multiple controllers, in various embodiments, may operate independent of each other and control only the respective TECs in communication. Moreover, in various embodiments, multiple controllers may be in communication with each other. The multiple controllers may be designed to communicate data regarding input power and temperature data of TECs to other controllers not directly in control. The data may be implemented by adjusting current input power control to account for data from surrounding TECs. Additionally, arranging TEC arrays in series or parallel may result in an additional layer of control. Different TEC arrays (rows) may have different temperature gradient parameters.

In various embodiments, the controller sets the input power at a constant voltage and varies the current supplied, thereby providing variable power to a TEC. As previously described, the variable input power controls the temperature difference between the two substrates of the TEC. This temperature difference facilitates control of the expansion or contraction of the coupled turbine case.

In accordance with various embodiments, aircraft propulsion system 100 may further comprise at least one sensor, such as a temperature sensor, an optical sensor, or a microwave sensor. In various embodiments, the sensor may be positioned between the BOAS (blade outer air seal) and a tip of the turbine blade and relay blade gap data. In various embodiments, the controller may receive feedback data from the at least one sensor and analyze the sensor data to determine if adjustments should be made in the temperature difference of the TEC. A higher temperature difference is achieved by providing more power to a TEC, thereby decreasing the temperature of the colder substrate of the TEC.

Furthermore, different portions of the aircraft may have different heating or cooling conditions and the cooling system may be adapted to take the different conditions into account. Namely, in various embodiments, TEC arrays may be independently controlled for independent cooling of specific portions of the turbine case. For example, TEC arrays coupled to the turbine case near the combustion area may need more cooling than TEC arrays coupled to the exhaust portion or intake portion of the turbine case. A variety of other temperature differences may be achieved, depending upon the TEC selected, the number of TECs, initial temperature differential, input power, and the like. Thus, a TEC array (e.g., array 302) may be added to the aircraft propulsion system 100, as needed and/or where possible to control case cooling and disperse heat energy generated by the aircraft propulsion system 100.

Any suitable portion of aircraft propulsion system 100 may be equipped with a TEC array 302. For example, any portion of aircraft propulsion system 100 in which a temperature gradient exists between a first portion of aircraft propulsion system 100 and a second portion of aircraft propulsion system 100 may be equipped with a TEC array 302. Further, and more generally as described herein, a TEC array 302 may be suitably equipped on any portion of aircraft propulsion system 100 that experiences a temperature gradient and benefits from controlled cooling. For instance, in addition to the examples discussed above, TEC arrays 302 may be placed on any engine coolers (e.g., on any air cooled or oil cooled surface of cooling system), between a heat blanket and an inner surface of the nacelle 102, on an outer surface of a heat blanket mounted to an inner surface of the nacelle 102, and the like.

Typically, an alternator (e.g., a permanent magnet alternator or "PMA") may be used to generate the electrical output needed to power the TEC arrays associated with aircraft propulsion system 100. The PMA may be situated within a gearbox within aircraft propulsion system 100. Thus, the mechanical energy generated by aircraft propulsion system 100 may be used to operate the PMA, which in turn may power the cooling operation of TEC 200. Approximately 20-200 watts may be typically required to power an individual TEC associated with an aircraft propulsion system 100.

Figure 5:
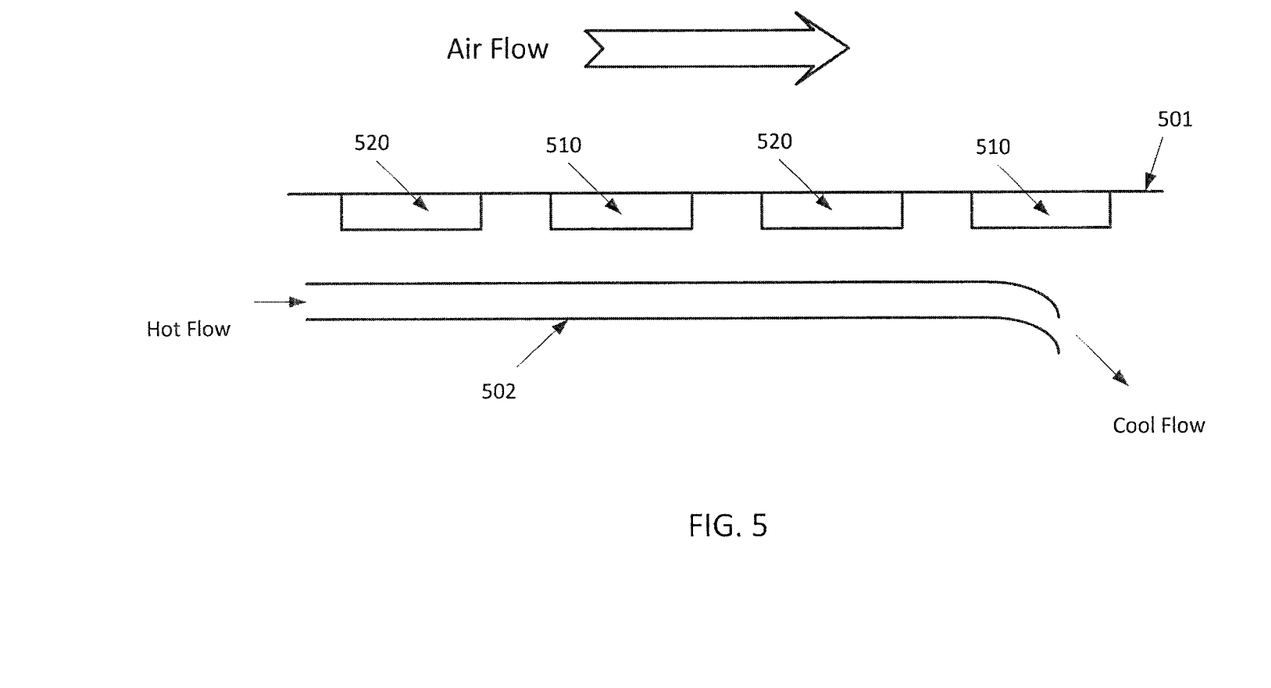
FIG. 5 illustrates, in accordance with various embodiments, a cross-sectional view of alternating TEC arrays and TEG arrays on a jet aircraft propulsion system.

In additional to a PMA power source, in various embodiments, the power provided to the TECs may be supplied by a thermoelectric generator ("TEG"). A TEG converts heat energy being diffused on the aircraft into electrical energy. For additional description of generating power by a TEG and various embodiments of a TEG on an aircraft, U.S. Provisional No. 61/878,494 is hereby incorporated by reference in its entirety. In various embodiments and with reference to FIG. 5, TEC arrays 510 may be interleaved with TEG arrays 520 in a designed manner on a turbine case 501 and in proximity to a heat exchanger 502. For example, TEC arrays 510 may be alternated with TEG arrays 520, or several TEC arrays 510 may alternate with one or more TEG arrays 520, thereby alternating heat extraction with power generation.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. An aircraft jet propulsion system comprising:
   a turbine case;
   a gearbox;
   heat fins coupled to a first side of the turbine case;
   an array of thermoelectric coolers (TECs) disposed axially on a second side of the turbine case, the second side being opposite the first side of the turbine case, wherein each TEC of the array of TECs comprises a first substrate and a second substrate, wherein an input power generates a temperature difference between the first substrate and the second substrate;
   an epoxy layer disposed between the second side of the turbine case and the array of TECs, the epoxy layer being configured to conduct heat from the array of TECs to the turbine case through to the heat fins:
   an array of thermoelectric generators (TEGs) coupled to the second side of the turbine case and interleaved between the array of TECs, wherein the array of TEGs converts heat energy to electrical energy, wherein the array of TEGs is configured to supply the input power to at least one TEC of the array of TECs; and
   a controller configured to control the input power provided to each TEC of the array of TECs,
   wherein the array of TECs are configured to facilitate controlled cooling of the turbine case in response to the input power provided to each TEC of the array of TECs from the array of TEGs.

2. The aircraft jet propulsion system of claim 1, further comprising at least one heat sink coupled to the second substrate of at least one TEC of the array of TECs.

3. The aircraft jet propulsion system of claim 1, further comprising a permanent magnet alternator disposed within the gearbox, wherein the input power provided to each TEC of the array of TECs is supplied in part by the permanent magnet alternator.

4. The aircraft jet propulsion system of claim 1, further comprising a thermoelectric generator configured to supply the input power to at least one TEC of the array of TECs.

5. The aircraft jet propulsion system of claim 1, further comprising a temperature sensor configured to sense a temperature of the turbine case and provide a temperature data to the controller.

6. The aircraft jet propulsion system of claim 1, further comprising a sensor in communication with the controller, wherein the sensor is configured to measure gap distance data comprising a distance between two components of the aircraft jet propulsion system-and to provide the gap distance data to the controller.

7. The aircraft jet propulsion system of claim 6, wherein the array of TECs and the controller provide active clearance control of the two components.

8. The aircraft jet propulsion system of claim 6, wherein the input power provided to the TEC is adjusted in response to the gap distance data of the two components.

9. The aircraft jet propulsion system of claim 8, wherein the two components are a turbine blade and a blade outer air seal.

10. The aircraft jet propulsion system of claim 1, wherein the controller is part of a core controller of the aircraft jet propulsion system.

11. The aircraft jet propulsion system of claim 1, wherein heat is extracted from the array of TECs and heat power is generated from the array of TEGs.

\* \* \* \* \*